(12) United States Patent
Mizuno et al.

(10) Patent No.: US 10,608,136 B2
(45) Date of Patent: Mar. 31, 2020

(54) METHOD OF BONDING SEMICONDUCTOR ELEMENTS AND JUNCTION STRUCTURE

(71) Applicant: National Institute of Advanced Industrial Science and Technology, Tokyo (JP)

(72) Inventors: Hidenori Mizuno, Ibaraki (JP); Kikuo Makita, Ibaraki (JP)

(73) Assignee: National Institute of Advanced Industrial Science and Technology, Tokyo (JP)

(*) Notice: Subject to any disclaimer, the term of this patent is extended or adjusted under 35 U.S.C. 154(b) by 0 days.

(21) Appl. No.: 14/351,935

(22) PCT Filed: Oct. 17, 2012

(86) PCT No.: PCT/JP2012/076867
§ 371 (c)(1),
(2) Date: Apr. 15, 2014

(87) PCT Pub. No.: WO2013/058291
PCT Pub. Date: Apr. 25, 2013

(65) Prior Publication Data
US 2014/0238485 A1    Aug. 28, 2014

(30) Foreign Application Priority Data

Oct. 17, 2011  (JP) .................................. 2011-227787
Jun. 22, 2012  (JP) .................................. 2012-141032

(51) Int. Cl.
*H01L 25/04*  (2014.01)
*H01L 31/18*  (2006.01)
(Continued)

(52) U.S. Cl.
CPC ................ *H01L 31/18* (2013.01); *C09J 5/00* (2013.01); *H01L 24/29* (2013.01); *H01L 25/043* (2013.01);
(Continued)

(58) Field of Classification Search
CPC .......... H01L 2224/29164; H01L 24/29; H01L 2224/2732; H01L 2224/29109;
(Continued)

(56) References Cited

U.S. PATENT DOCUMENTS 6,657,378 B2 * 12/2003 Forrest ................. H01L 27/302
  250/208.1
8,389,055 B2    3/2013 Watanabe et al.
(Continued)

FOREIGN PATENT DOCUMENTS

JP    09326414 A1   12/1997
JP    H09326416 A1  12/1997
(Continued)

OTHER PUBLICATIONS

M. Aizawa et al., "Block Copolymer Templated Chemistry for the Formation of Metallic Nanoparticle Arrays on Semiconductor Surfaces", Chemistry of Materials, vol. 19, No. 21, pp. 5090-5101, Sep. 2007.
(Continued)

Primary Examiner — Golam Mowla
(74) Attorney, Agent, or Firm — Howson & Howson LLP

(57) ABSTRACT

[Problem] The present invention provides a method for bonding semiconductor elements while assuring excellent electric conductivity and transparency at an interface, and a junction structure according to the bonding method. The present invention also provides a method for bonding semiconductor elements wherein excellent electric conductivity is assured at an interface and optical characteristics favor-
(Continued)

101: Semiconductor element junction structure
102: Bottom semiconductor element
103: Top semiconductor element
104: Electrically conductive nano particle able for element characteristics can be designed, and a junction structure according to the bonding method.

[Solution] Electrically conductive nano particles which are not covered with organic molecules are arrayed on a surface of one semiconductor element without causing optical loss, and another semiconductor element is pressure-bonded thereagainst.

15 Claims, 6 Drawing Sheets

(51) Int. Cl.
*C09J 5/00* (2006.01)
*H01L 31/076* (2012.01)
*H01L 31/043* (2014.01)
*H01L 23/00* (2006.01)
*H01L 25/00* (2006.01)

(52) U.S. Cl.
CPC .......... *H01L 31/043* (2014.12); *H01L 31/076* (2013.01); *C09J 2203/326* (2013.01); *C09J 2453/00* (2013.01); *H01L 25/50* (2013.01); *H01L 2224/2732* (2013.01); *H01L 2224/29109* (2013.01); *H01L 2224/29118* (2013.01); *H01L 2224/29124* (2013.01); *H01L 2224/29139* (2013.01); *H01L 2224/29144* (2013.01); *H01L 2224/29155* (2013.01); *H01L 2224/29164* (2013.01); *H01L 2224/29166* (2013.01); *H01L 2224/29193* (2013.01); *H01L 2224/32145* (2013.01); *H01L 2224/8382* (2013.01); *H01L 2224/83203* (2013.01); *H01L 2224/83894* (2013.01); *H01L 2224/83895* (2013.01); *H01L 2225/06513* (2013.01); *H01L 2924/10252* (2013.01); *H01L 2924/10253* (2013.01); *H01L 2924/10328* (2013.01); *H01L 2924/10329* (2013.01); *H01L 2924/10335* (2013.01); *H01L 2924/15788* (2013.01); *Y02E 10/548* (2013.01)

(58) Field of Classification Search
CPC . H01L 2224/29124; H01L 2224/29139; H01L 2224/29144; H01L 2224/29166; H01L 2224/29193; H01L 2224/83203; H01L 2224/8382; H01L 2224/83894; H01L 2224/83895; H01L 2924/10252; H01L 2924/10253; H01L 2924/10329; H01L 2924/10335; H01L 2225/06513; H01L 2224/29155; H01L 2224/29118; H01L 2924/10328; H01L 31/076; H01L 2924/15788; H01L 2224/32145; H01L 2924/00

See application file for complete search history.

(56) References Cited

U.S. PATENT DOCUMENTS

| | | | |
|---|---|---|---|
| 2003/0042846 A1* | 3/2003 | Forrest | H01L 27/302 313/503 |
| 2004/0245648 A1 | 12/2004 | Nagasawa et al. | |
| 2006/0027834 A1* | 2/2006 | Forrest | B82Y 10/00 257/183 |
| 2006/0090790 A1* | 5/2006 | Kobayashi | H01L 31/02168 136/256 |
| 2006/0138453 A1* | 6/2006 | Thompson | B82Y 10/00 257/183 |
| 2007/0227588 A1* | 10/2007 | Gossard | H01L 31/0352 136/255 |
| 2008/0230120 A1* | 9/2008 | Reddy | H01L 27/302 136/260 |
| 2009/0255579 A1* | 10/2009 | Zaimidoroga | B82Y 20/00 136/256 |
| 2010/0012358 A1 | 1/2010 | Tatsuzawa et al. | |
| 2010/0089449 A1* | 4/2010 | Ahn | H01L 31/0725 136/258 |
| 2010/0089980 A1 | 4/2010 | Maeda | |
| 2010/0093131 A1 | 4/2010 | Maeda | |
| 2012/0199988 A1 | 8/2012 | Meura et al. | |
| 2013/0081683 A1* | 4/2013 | Masunaga | H01L 31/06 136/255 |

FOREIGN PATENT DOCUMENTS

| | | | |
|---|---|---|---|
| JP | 2003309352 A | 10/2003 | |
| JP | 2004-107728 A | 4/2004 | |
| JP | 2006-088310 A | 4/2006 | |
| JP | 2007-204778 A | 8/2007 | |
| JP | 2008-208442 A | 9/2008 | |
| JP | 2011-138711 A | 7/2011 | |
| WO | 2009/131193 A1 | 10/2009 | |
| WO | WO 2011/125101 A1 * | 10/2011 | H01L 31/06 |

OTHER PUBLICATIONS

Y. Loo et al., "Interfacial Chemistries for Nanoscale Transfer Printing", Journal of the American Chemical Society, vol. 124, No. 26, pp. 7654-7655 (Abstract Only), Jun. 5, 2002.

N. Hatab et al., "Surface-Enhanced Raman Spectroscopy Substrates Created via Electron Beam Lithography and Nanotransfer Printing", ACS Nano, vol. 2, No. 2, pp. 377-385 (Abstract Only), Jan. 12, 2008.

M. P. Hanson et al., "Microstructure and Electronic Characterization of InGaAs Containing Layers of Self-Assembled ErAs Nanoparticles", Phisica E, vol. 13, pp. 602-605, 2002 (month unknown).

Wikipedia, "Quantum Tunnelling", 11 pages printed from Internet, (date unknown).

\* cited by examiner

[Fig. 1]
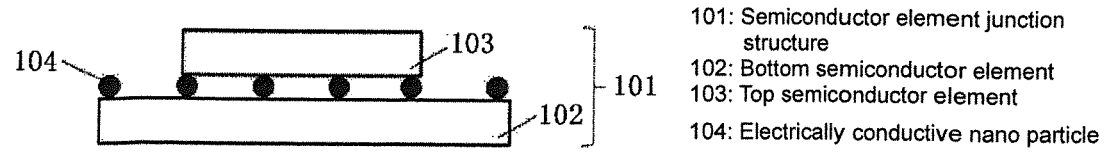
101: Semiconductor element junction structure
102: Bottom semiconductor element
103: Top semiconductor element
104: Electrically conductive nano particle
[Fig. 2]
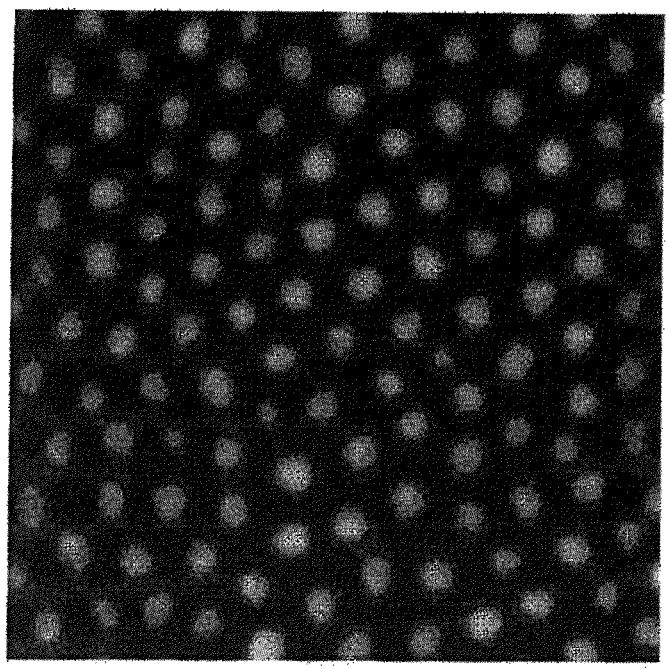

[Fig. 3]
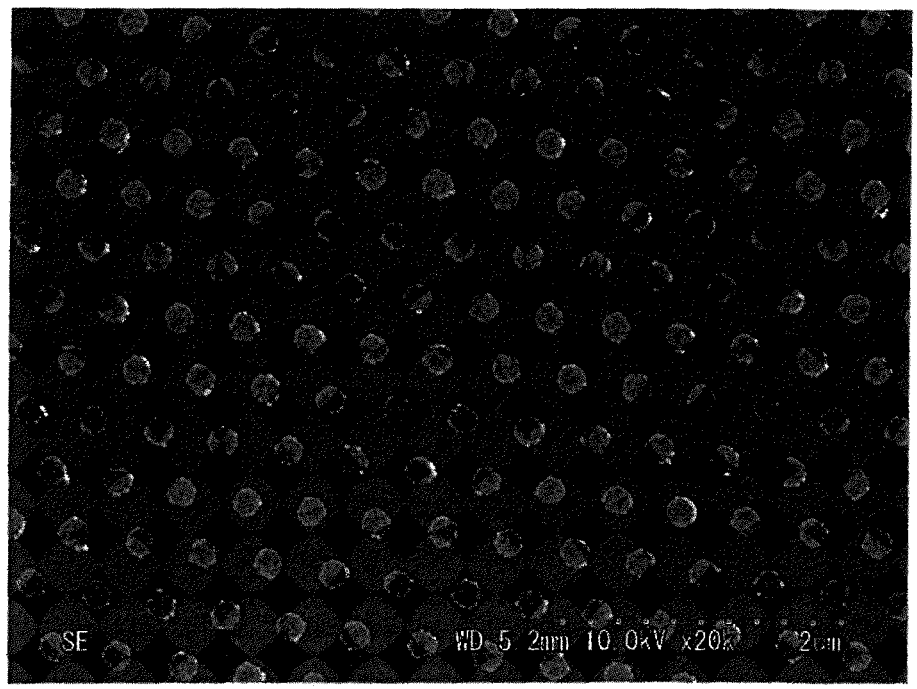
[Fig. 4]
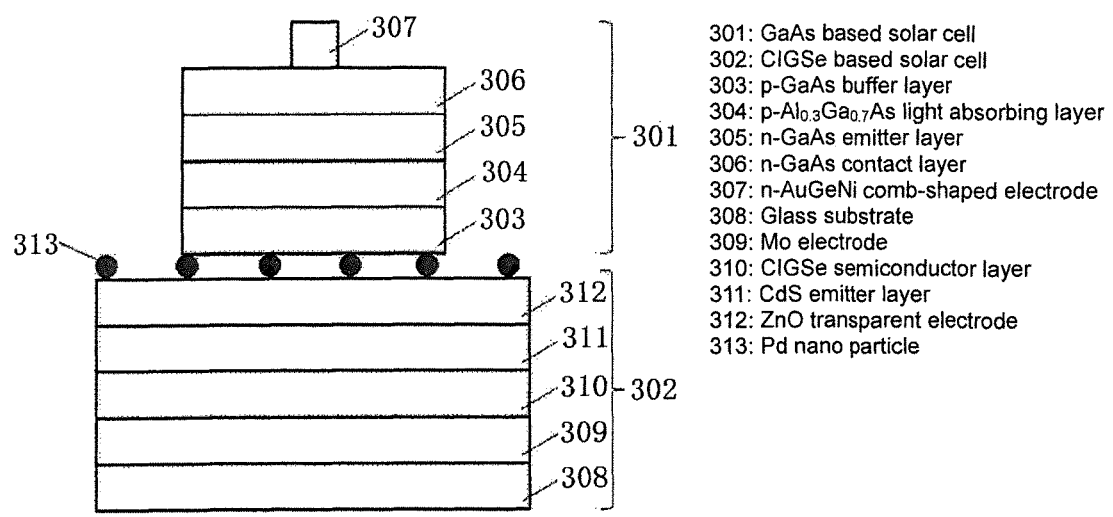
301: GaAs based solar cell
302: CIGSe based solar cell
303: p-GaAs buffer layer
304: p-Al$_{0.3}$Ga$_{0.7}$As light absorbing layer
305: n-GaAs emitter layer
306: n-GaAs contact layer
307: n-AuGeNi comb-shaped electrode
308: Glass substrate
309: Mo electrode
310: CIGSe semiconductor layer
311: CdS emitter layer
312: ZnO transparent electrode
313: Pd nano particle

[Fig. 5]
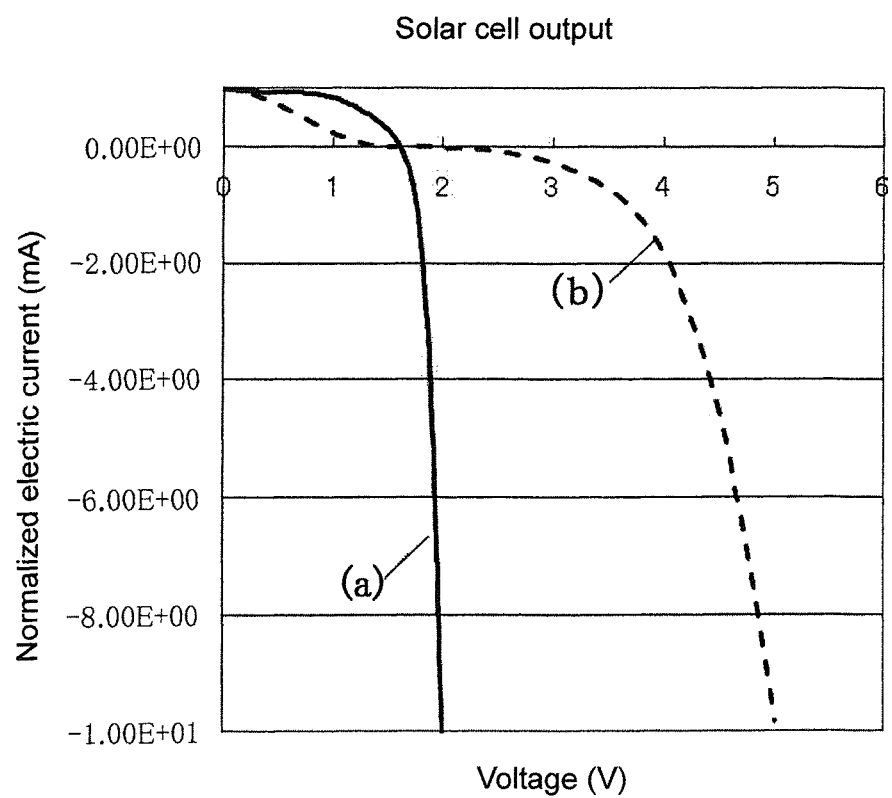

[Fig. 6]

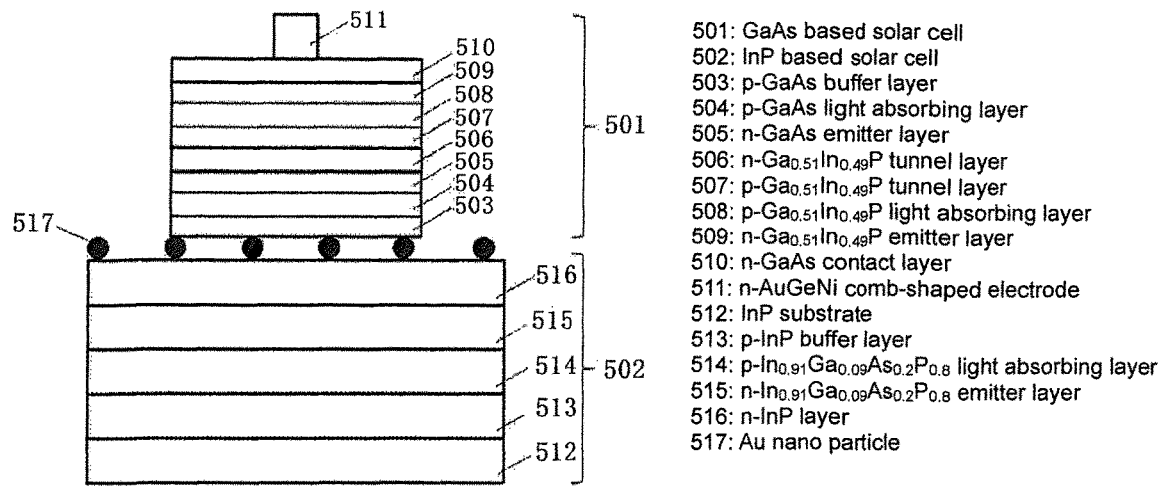

501: GaAs based solar cell
502: InP based solar cell
503: p-GaAs buffer layer
504: p-GaAs light absorbing layer
505: n-GaAs emitter layer
506: n-Ga$_{0.51}$In$_{0.49}$P tunnel layer
507: p-Ga$_{0.51}$In$_{0.49}$P tunnel layer
508: p-Ga$_{0.51}$In$_{0.49}$P light absorbing layer
509: n-Ga$_{0.51}$In$_{0.49}$P emitter layer
510: n-GaAs contact layer
511: n-AuGeNi comb-shaped electrode
512: InP substrate
513: p-InP buffer layer
514: p-In$_{0.91}$Ga$_{0.09}$As$_{0.2}$P$_{0.8}$ light absorbing layer
515: n-In$_{0.91}$Ga$_{0.09}$As$_{0.2}$P$_{0.8}$ emitter layer
516: n-InP layer
517: Au nano particle

[Fig. 7]

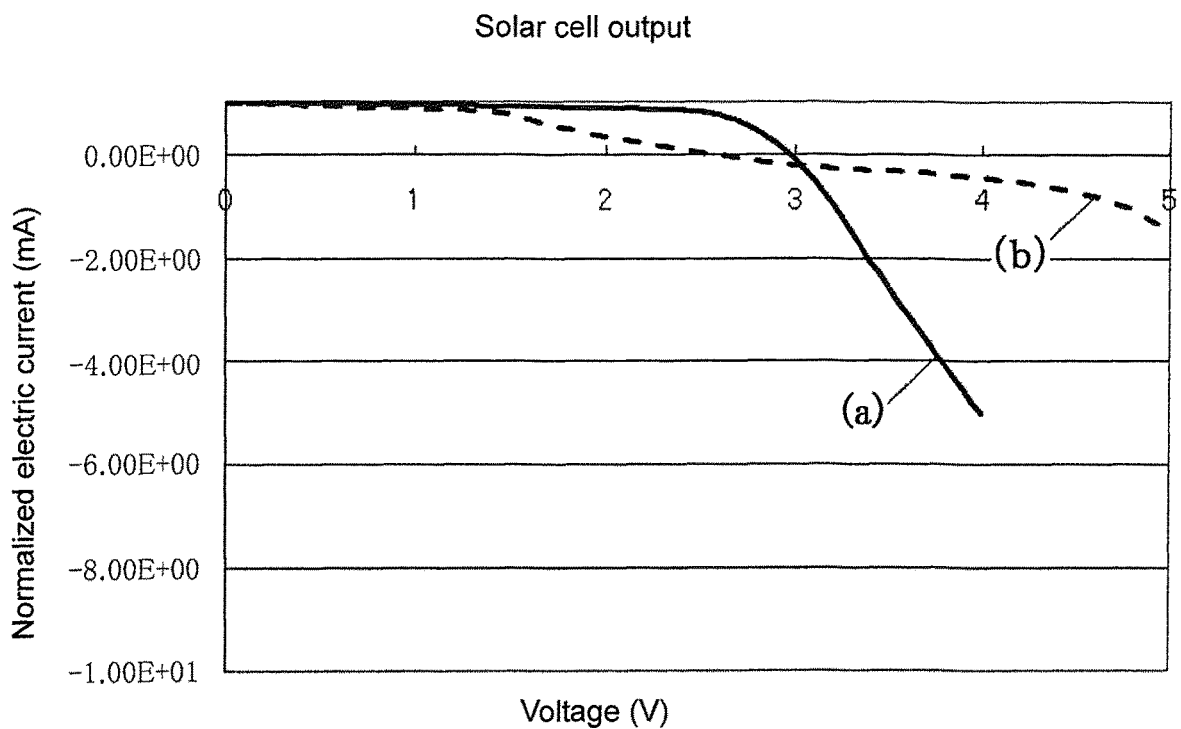

[Fig. 8]

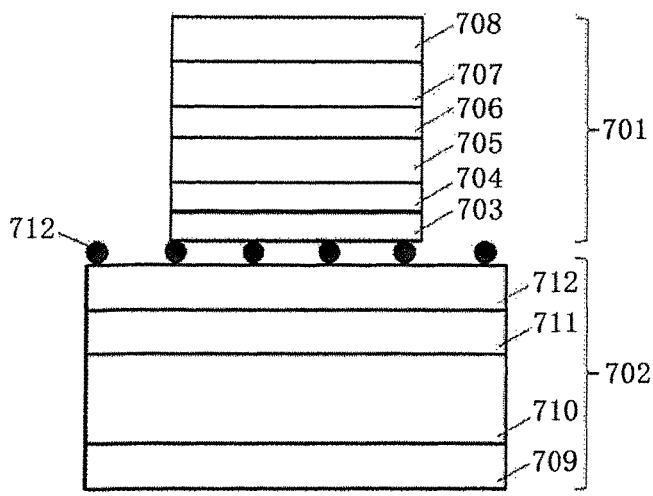

701 : Amorphous Si solar cell
702 : Crystalline Si solar cell
703: ZnO transparent electrically conductive layer
704: n-amorphous Si layer
705: i-amorphous Si light absorbing layer
706: p-amorphous Si layer
707: Fluorine doped $SnO_2$ transparent electrically conductive layer
708: Glass substrate
709: Al electrode
710: n-crystalline Si layer
711: p-crystalline Si layer
712: ITO transparent electrically conductive layer
713: Pt nano particle

[Fig. 9]

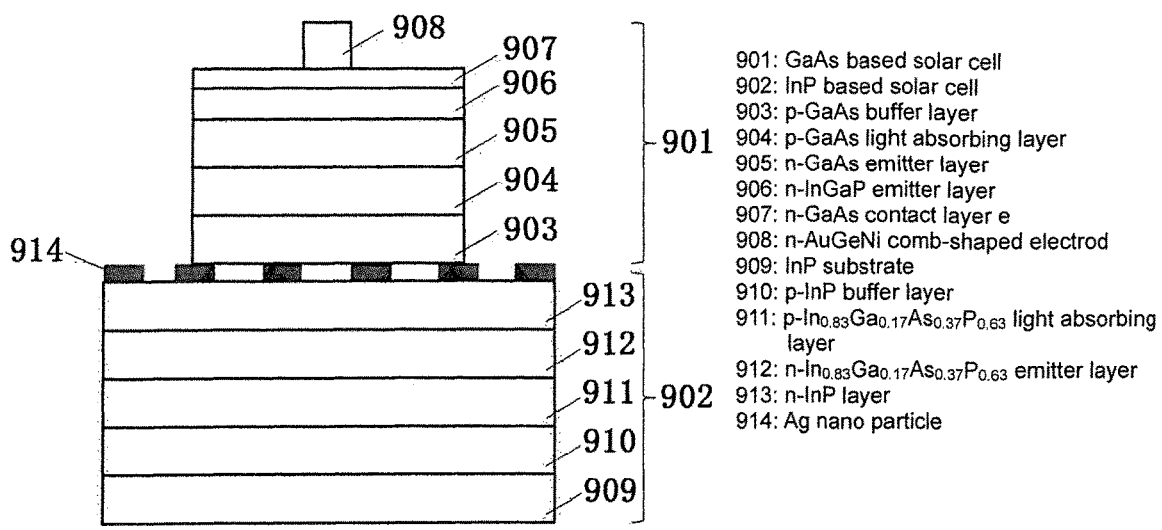

901: GaAs based solar cell
902: InP based solar cell
903: p-GaAs buffer layer
904: p-GaAs light absorbing layer
905: n-GaAs emitter layer
906: n-InGaP emitter layer
907: n-GaAs contact layer e
908: n-AuGeNi comb-shaped electrod
909: InP substrate
910: p-InP buffer layer
911: p-$In_{0.83}Ga_{0.17}As_{0.37}P_{0.63}$ light absorbing layer
912: n-$In_{0.83}Ga_{0.17}As_{0.37}P_{0.63}$ emitter layer
913: n-InP layer
914: Ag nano particle

[Fig. 10]
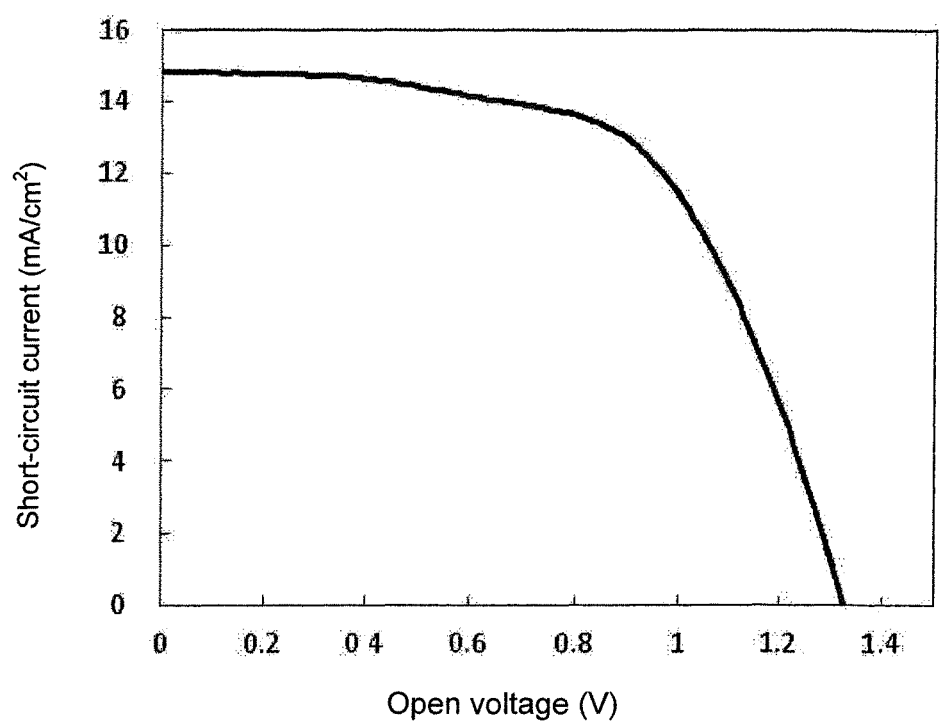

10,608,136 B2

METHOD OF BONDING SEMICONDUCTOR ELEMENTS AND JUNCTION STRUCTURE

BACKGROUND

The present invention relates to a method of bonding semiconductor elements and a junction structure.

Higher performance can be achieved for semiconductor devices by bonding individual semiconductor elements. Representatively, for solar cells that are photoelectric conversion semiconductor elements, a broad sunlight spectrum can be absorbed by layering solar cells having a different band gap to form multiple junctions. This can improve photoelectric conversion efficiency.

In general, these multi-junction solar cells have a monolithic stack structure in which a III-V group semiconductor cell (GaAs based) is formed on a GaAs substrate or a Ge substrate by bulk growth. In this case, a performance in which power generation efficiency is 40% or more can be achieved by using a Ge or InGaAs system sensitive to a long wavelength range as a bottom cell. However, since the combination of these materials is a lattice mismatch system, their growth procedure is complicated, contributing to a cost-increasing factor.

Meanwhile, a smart stack structure, which has attracted much attention in recent years, has a structure in which two or more cells are mechanically bonded in various fashions to allow various cells to be easily combined, representing a key technology for the next-generation solar cell in view of high performance and lower cost. In the smart stack structure, it is important to obtain a junction structure having not only electric conductivity but also transparency assured at a bonding interface for each solar cell. Further, obtaining optical characteristics favorable for solar cells is also important equally to or not less than assuring transparency.

Conventionally, as a method of bonding semiconductor elements including solar cells, an approach is known in which an electrically conductive adhesive, i.e., an organic polymer resin comprising a micron-sized particulate metal compound and a metal nanowire is used for bonding as described in, for example, Patent Documents 1 and 2.

Further, for example, as described in Patent Document 3, a method of bonding semiconductor elements has been reported in which using electrically conductive nano particles covered with organic molecules having a diameter of 100 nm or less, low temperature sintering between electrically conductive nano particles is performed taking advantage of the melting point depression based on nano-sizing.

However, by the above approach, a junction structure having electrical conductivity and transparency assured at a semiconductor element interface is difficult to obtain for the following reasons. Moreover, optical characteristics favorable for solar cells are also difficult to obtain.

First, in the case of Patent Documents 1 and 2, electric conductivity may be decreased, or activity may be lost because contact failures of particulate metallic compounds and metal nanowires may occur due to the thermal expansion of an organic polymer resin induced by heat generated from the element itself at the time of instrument operation after bonding, changes in ambient air temperature and the like. Moreover, in order to maintain light transmission, the concentrations of the particulate metallic compounds and the metal nanowires need to be kept low, which is unfavorable for electric conductivity.

Next, in the case of Patent Document 3, the electrically conductive nano particles having a diameter of 100 nm or less, which are used herein, are usually covered with a protective layer comprising organic molecules in order to improve handling properties. However, in order to obtain good electric conductivity after bonding, something has to be done to prevent these organic molecules remaining after sintering.

Moreover, as described above, in order to maintain transparency or light transmission at an interface, the concentration of electrically conductive nano particles also needs to be low and uniformly present at the interface to prevent the generation of a large sintered compact of the electrically conductive nano particles. However, bonding itself can be difficult because a decreased particle concentration leads to a decreased sintering frequency.

Meanwhile, although not a technology for bonding semiconductor elements such as solar cells each other as described above, applications for used in elements have been considered in which metal nano particles are arrayed in two dimensions on a substrate surface using an amphiphilic block copolymer as a template in expectation of the quantum size effect (see Patent Documents 4, 5). However, no exploration has been attempted for electroconductively bonding semiconductor elements each other through metal (electrically conductive) nano particles arrayed on a surface without using an adhesive such as organic molecules and an adhesive material.

Further, although not a technology for bonding semiconductor elements such as solar cells each other as described above, applications have been considered in which a nano structure is created by transferring a thin film of a metal and the like deposited on another substrate surface by the vapor deposition method and the like using a stamp having any 3-dimensional pattern (Non-Patent Document 1) for use in a sensor element and the like (Non-Patent Document 2). However, even in the case of the stamp technology, no exploration has been attempted for electroconductively bonding semiconductor elements each other through metal (electrically conductive) nano particles arrayed on a surface without using an adhesive such as organic molecules, and an adhesive material.

Patent Document 1: Japanese Patent Application Laid-Open No. 2003-309352
Patent Document 2: Japanese Patent Application Laid-Open No. 2011-138711
Patent Document 3: Japanese Patent Application Laid-Open No. 2004-107728
Patent Document 4: Japanese Patent Application Laid-Open No. 2006-88310
Patent Document 5: WO2007/122998
Non-Patent Document 1: Loo et al., *Journal of the American Chemical Society*, 124 (2002), 7654.
Non-Patent Document 2: Hatab et al., *ACS Nano*, 2 (2008), 377.

SUMMARY OF INVENTION

The present invention involves an approach developed for compensating disadvantages in the existing approaches for bonding semiconductors each other as described above. An object of the present invention is to provide a method of bonding semiconductor elements wherein good electric conductivity and transparency are assured at an interface, and a junction structure according to the bonding method.

Further, another object of the present invention is to provide a method of bonding semiconductor elements wherein good electric conductivity is assured at an interface, and wherein an optical characteristic favorable for element characteristics can be designed, and further provide a junction structure according to the bonding method.

In the course of various studies and research to achieve the above objects, the present inventors have found that even in a case where electrically conductive nano particles not covered with organic molecules are arrayed on a bonding interface of semiconductor elements, the both semiconductor elements can be bonded without using a commonly used adhesive such as organic molecules or an adhesive material, and further, the both semiconductor elements can be electroconductively connected. The bonding method according to the present invention, which is based on the above findings in view of the above objects, comprises arraying a monolayer of electrically conductive nano particles not covered with organic molecules on a surface of one semiconductor element, and pressure-bonding another semiconductor element thereagainst.

That is, the present invention has the following features.
(1) A method of bonding semiconductor elements, comprising: arraying electrically conductive nano particles not covered with organic molecules on a surface of one semiconductor element, and pressure-bonding another semiconductor element thereagainst.
(2) The method of bonding semiconductor elements according to (1), wherein an array of the electrically conductive nano particles on the surface of the semiconductor element is formed using a block copolymer thin film as a template.
(3) The method of bonding semiconductor elements according to (1), wherein the array of the electrically conductive nano particles on the surface of the semiconductor element is formed by a transfer approach using a stamp having a shape pattern thereon.
(4) The method of bonding semiconductor elements according to any one of (1) to (3), wherein the electrically conductive nano particles have a size of between 100 nm and 500 nm inclusive.
(5) The method of bonding semiconductor elements according to (1) or (2), wherein the electrically conductive nano particles have a size of between 10 nm and 200 nm inclusive.
(6) The method of bonding semiconductor elements according to any one of (1) to (5), wherein an array spacing between the electrically conductive nano particles is between 2 times and 10 times inclusive of the size of the electrically conductive nano particles.
(7) The method of bonding semiconductor elements according to any one of (1) to (6), wherein the electrically conductive nano particles comprise Pd, Au, Ag, Pt, Ni, Al, In, $In_2O_3$, Zn, ZnO, or composites thereof.
(8) The method of bonding semiconductor elements according to any one of (1) to (7), wherein the semiconductor element is a single-junction solar cell in which a crystalline Si based, an amorphous Si based, a microcrystalline Si based, an organic based, or a chalcopyrite based material is used, or is a solar cell comprising 2 or more junctions grown on a GaAs, InP, GaSb or Ge substrate or the like.
(9) A junction structure of a pair of semiconductor elements, wherein electrically conductive nano particles not covered with organic molecules are present at a bonding interface between both semiconductor elements.
(10) The junction structure of semiconductor elements according to (9), wherein the electrically conductive nano particles present at a bonding interface between both semiconductor elements form a monolayer.
(11) The junction structure of semiconductor elements according to (9) or (10), wherein the pair of semiconductor elements have a semiconductor layer or an electrically conductive layer on the bonding surface.
(12) A semiconductor element layered body having the junction structure between adjacent semiconductor elements according to any one of (9) to (11), wherein translucency is provided at least up to a bonding surface farthest from one end face of the semiconductor element layered body in the layering direction.
(13) The semiconductor element layered body according to (12), wherein the semiconductor element has a photoelectric conversion function.
(14) The semiconductor element layered body according to (13), wherein the semiconductor element having a photoelectric conversion function is a solar cell.

According to the bonding method of the present invention, a semiconductor element junction structure having good electric conductivity and transparency can be obtained. In particular, when used in bonding two or more solar cells having different band gaps, a broad sunlight spectrum can be absorbed to improve photoelectric conversion efficiency. Furthermore, taking advantage of optical characteristics derived from a nano structure, photoelectric conversion efficiency can also be improved by the light trapping effect.

BRIEF DESCRIPTION OF DRAWINGS

FIG. 1 shows a schematic diagram illustrating a cross section of a junction structure of semiconductor elements in one embodiment using the bonding method according to the present invention.

FIG. 2 shows an illustrative view of a hexagonal array in an atomic force microscope image of a block copolymer thin film used in Example of the present invention.

FIG. 3 shows an illustrative view of a hexagonal array of a metal nano structure created with a pattern forming stamp used in Example of the present invention.

FIG. 4 shows a schematic diagram illustrating a cross section of a junction structure of a GaAs/CIGSe based 2-junction solar cell manufactured according to Example of the present invention.

FIG. 5 shows (a) the IV characteristics of the GaAs/CIGSe based 2-junction solar cell manufactured according to Example of the present invention, and (b) the IV characteristics of the GaAs/CIGSe based 2-junction solar cell in which palladium nano particles are not present.

FIG. 6 shows a schematic diagram illustrating a cross section of a junction structure of a GaAs/InP based 2-junction solar cell manufactured according to Example of the present invention.

FIG. 7 shows (a) the IV characteristics of the GaAs/InP based 2-junction solar cell manufactured according to Example of the present invention, and (b) the IV characteristics of the GaAs/InP based 2-junction solar cell in which gold nano particles are not present.

FIG. 8 shows a schematic diagram illustrating a cross section of a junction structure of an amorphous silicon/crystalline silicon based 2-junction solar cell manufactured according to Example of the present invention.

FIG. 9 shows a schematic diagram illustrating a cross section of a junction structure of a GaAs/InP based 2-junction solar cell manufactured according to Example of the present invention.

FIG. 10 shows the IV characteristics of the GaAs/InP based 2-junction solar cell manufactured according to Example of the present invention.

DETAILED DESCRIPTION

Below, the present invention will be described in detail with reference to the Figures.

FIG. 1 is a schematic diagram showing a cross section of a junction structure of semiconductor elements according to the bonding method of the present invention. In FIG. 1, a junction structure 101 comprises a bottom semiconductor element 102 and a top semiconductor element 103, the elements being bonded together with electrically conductive nano particles 104 present therebetween.

The bottom semiconductor element 102 and the top semiconductor element 103 each preferably have a semiconductor layer or an electrically conductive layer at a bonding surface. In that case, a semiconductor layer and/or an electrically conductive layer at one bonding surface is electroconductively connected with a semiconductor layer and/or an electrically conductive layer at the other bonding surface through the electrically conductive nano particle 104.

The number of semiconductor elements bonded each other is not limited to one pair, but is preferably selected within a range where required translucency is assured in a semiconductor element layered (stacked) body. Preferably, semiconductor elements to be bonded include translucent elements and photoelectric conversion elements. Photoelectric conversion elements are preferably those which can convert light into electric energy such as solar cells. However, those which can convert electric energy into light in an opposite manner may be used.

Solar cells include GaAs based solar cells; CIS based (chalcopyrite based) solar cells; compound based solar cells such as solar cells comprising a single junction or two or more junctions grown on a GaAs, InP, GaSb or Ge substrate; silicon based solar cells such as crystalline Si solar cells, amorphous Si solar cells and microcrystalline Si solar cell; organic based solar cells; dye sensitized solar cells; and the like.

Electrically conductive nano particles include metal nano particles such as Pd, Au, Ag, Pt, Ni Al, Zn and In; and metal oxide nano particles such as ZnO and $In_2O_3$; and the like. The size of electrically conductive nano particles is preferably 10 nm or more in order to obtain good electric conductivity, more preferably 20 nm or more and even more preferably 30 nm or more. On the other hand, in order to control the absorption and scattering of light by nano particles, the size is preferably 100 nm or less, more preferably 80 nm or less and even more preferably 60 nm or less. However, as long as the size is 200 nm or less (more preferably 150 nm or less and even more preferably 120 nm or less), the absorption and scattering of light can be controlled better than in the case beyond 200 nm. Meanwhile, in order to promote the light trapping effect by introducing nano particles, the size is preferably between 120 nm and 500 nm inclusive, more preferably between 150 nm and 300 nm inclusive and even more preferably between 180 nm and 250 nm inclusive. Note that the "the size D of electrically conductive nano particles" (hereinafter, the size D may be referred to as "a mean size") in the present invention is defined as follows.

$$D = (\Sigma Di)/n$$

[wherein D represents the size of electrically conductive nano particles; Di represents a particle diameter [=(longest diameter+shortest diameter)/2] of a certain particle present in a given observation field; and n represents the number of the particles present in the same observation field (n should be a sufficiently large number for statistical analysis, which is usually 20 or more)]

Electrically conductive nano particles are not covered with a protective layer such as organic molecules and an adhesive or an adhesive material, and form a monolayer in which individual particles are uniformly arrayed. For example, as shown in FIGS. 2 and 3, a (pseudo) hexagonal array can be formed in which six particles are arranged in a hexagonal fashion around any one particle. The array spacing between electrically conductive nano particles is preferably 2 times or more of the size of the nano particles in order to allow better light transmission (more preferably 3 times or more). On the other hand, in order to assure required electric conductivity, it is preferably 10 times or less (more preferably 7 times or less). For example, when the size of electrically conductive nano particles is 40 nm, the array spacing will be between 80 nm and 400 nm inclusive. In that case, electrically conductive nano particles will make ohmic contacts with semiconductor elements thereabove and therebeneath, and will be uniformly arrayed on an interface. Therefore, excellent electric conductivity can be obtained. Further, because aggregation between particles is suppressed, excellent light transmittance can also be obtained. Meanwhile, for example, when the size of electrically conductive nano particles is 200 nm, the array spacing will be between 400 nm and 2000 nm inclusive. In that case, electrically conductive nano particles will make ohmic contacts with semiconductor elements thereabove and therebeneath, and will be uniformly arrayed on an interface. Therefore, excellent electric conductivity can be obtained. In addition, due to the optical characteristics of nano particles and a nano particle array, the light trapping effect, which is favorable for element characteristics, can also be obtained. Note that the "array spacing L of electrically conductive nano particles" in the present invention is defined as follows.

$$L = (1/n) \sum_{i}^{n} (1/6) \sum_{j}^{6} Lij \qquad \text{[Formula 1]}$$

L: array spacing between electrically-conductive nano particles
Li1: distance from a certain particle Pi (i=1, n) to the nearest adjacent particle Pi1
Li2: distance from Pi to the second nearest particle Pi2
Lij: distance from Pi to the j th nearest particle Pij
Li6: distance from Pi to the 6 th nearest particle Pi6
n: sufficiently large number for statistical analysis, usually 10 or more The junction structure according to the present invention can be formed as follows. First, a thin film of a block copolymer is formed on a surface of the bottom semiconductor element 102 to be bonded. Briefly, a block copolymer comprising polystyrene as a hydrophobic portion in a solution obtained by the dissolution in an organic solvent such as toluene and ortho-xylene, and poly-2-vinylpyridine as a hydrophilic portion are applied by an approach for forming a thin film such as the spin coating method and the dip coating method. On a surface of the bottom semiconductor element 102 obtained in this way, poly-2-vinylpyridine blocks form a pattern shown as white regions in FIG. 2 due to the phase separation of the block copolymer. Next, this semiconductor element is dipped in an aqueous solution in which a metal ion salt such as $Na_2PdCl_4$ is dissolved. In this way, metal ions (in this case, $Pd^{2+}$) can be incorporated into the aforementioned pattern comprising the poly-2-vinylpyridine blocks through chemical interactions with pyridine. After thoroughly washing, the resulting semiconductor element is subjected to treatments in which the block copolymers are removed and the metal ions are reduced. Then an array of electrically conductive nano particles which are not covered with organic molecules is created having the pattern maintained. Subsequently, the top semiconductor element 103 is stacked on the bottom semiconductor element 102 on which electrically conductive nano particles have been arrayed, and then bonding of the elements is performed under appropriate pressure and heating. An organic or inorganic based adhesive or adhesive material is not used in the bonding. The bonding may be achieved by using only van der Waals force, or may be achieved by performing the direct bonding method or the heat solid phase diffusion method after surface activation. Known surface activation treatment methods can be used such as plasma treatment, ozone treatment, treatment with an ion beam and the like for the surface activation.

In addition, the amphiphilic block copolymer used above is not particularly limited to one comprising polystyrene and poly-2-vinylpyridine, and other known block copolymers can be used. For example, they include block copolymers comprising two or more of the followings in combination; poly-4-vinylpyridine, polyethylene oxide, polypropylene oxide, polymethacrylic acid, polymethylmethacrylate, poly-N-isopropylacrylamide, polysiloxane, polyferrocenyl dimethylsilane, polyvinylpyrrolidone, polyethylene, polybutadiene, polyisobutylene, polyvinylnaphthalene, polylactone, polylactide and the like.

Moreover, the aforementioned metal ion salt is not particularly limited to $Na_2PdCl_4$, and the followings can also be used: for example, palladium ion salts such as $H_2PdCl_4$, $H_2PdCl_6$, $Na_2PdCl_6$, $K_2PdCl_4$, $K_2PdCl_6$, $Na_2PdBr_4$, $K_2PdBr_4$, $K_2Pd(CN)_4$, $K_2Pd(NO_3)_4$, $(NH_4)_2PdCl_4$, $(NH_4)_2PdCl_6$, $Pd(OH)_2$, $PdCl_2$, $PdBr_2$, $PdI_2$, $Pd(NO_3)_2$, $Pd(CN)_2$, $PdSO_4$, $Pd(OCOCH_3)_2$, $Pd(OCOCF_3)_2$ and $Pd(C_5H_7O_2)_2$; gold ion salts such as $HAuCl_4$, $NaAuCl_4$, $KAuCl_4$, $NH_4AuCl_4$, $AuCN$, $KAuCN_2$, $AuCl$, $AuCl_3$, $AuBr$, $AuI_3$, $AuCl$, $AuI_3$ and $Au(OCOCH_3)_3$; silver ion salts such as $AgNO_3$, $AgClO_4$, $AgCN$, $AgSCN$, $KAg(CN)_2$, $Ag_2CO_3$, $Ag_2SO_4$ and $AgOCOCH_3$; platinum ion salts such as $H_2PtCl_6$, $Na_2PtCl_4$, $Na_2PtCl_6$, $K_2PtCl_4$, $K_2PtCl_6$, $Na_2PtBr_4$, $K_2PtBr_4$, $K_2Pt(CN)_4$, $K_2Pt(NO_3)_4$, $(NH_4)_2PtCl_4$, $(NH_4)_2PtCl_6$, $Pt(OH)_2$, $PtCl_2$, $PtBr_2$, $PtI_2$, $Pt(NO_3)_2$, $Pt(CN)_2$, $PtSO_4$, $Pt(OCOCH_3)_2$, $Pt(OCOCF_3)_2$ and $Pt(C_5H_7O_2)_2$; nickel ion salts such as $NiCl_2$, $NiBr_2$, $NiI_2$, $NiF_2$, $Ni(NO_3)_2$, $Ni(CN)_2$, $NiCO_3$, $NiSO_4$, $Ni(ClO_4)_2$, $Ni(OCOCH_3)_2$, $Ni(OCOCF_3)_2$ and $Ni(C_5H_7O_2)_2$; indium ion salts such as $InCl$, $InCl_3$, $InBr$, $InBr_3$, $InI$, $InI_3$, $InF_3$, $In(NO_3)_3$, $In_2(SO_4)_3$, $In(OC_3H_7)_3$, $In(OCOCH_3)_3$ and $In(C_5H_7O_2)_3$; zinc ion salts such as $ZnCl_2$, $ZnBr_2$, $ZnI_2$, $ZnF_2$, $Zn(NO_3)_2$, $Zn(CN)_2$, $ZnCO_3$, $ZnSO_4$, $Zn(ClO_4)_2$, $Zn(OCOCH_3)_2$, $Zn(OCOCF_3)_2$ and $Zn(C_5H_7O_2)_2$; and the like. Further, in order to create an electrically conductive nano particle comprising a composite metal, two or more of the above metal ion salts can be used at the same time.

The block copolymer removal treatment and the metal ion reduction treatment described above are preferably performed in a single step, but may be performed in multiple steps of treatments in combination. These treatments include ultraviolet or electron beam irradiation, plasma treatment, chemical reduction method, or electrochemical reduction. Among these, plasma treatment and ultraviolet treatment (in particular vacuum ultraviolet treatment) are preferred. For example, when plasma treatment is performed using argon gas, a block copolymer thin film as a template is selectively etched by argon plasma and removed from an element surface while metal ions are not etched by argon plasma and reduced by electrons present in the plasma.

The gas for plasma treatment is not limited to argon gas. For example, a mixed gas in which hydrogen is mixed with argon in any ratio can also be used. Further, by using oxygen gas, electrically conductive nano particles comprising an oxide (ZnO, $In_2O_3$ and the like) can also be obtained.

The junction structure according to the present invention can also be formed as follows using a known microcontact printing method as an approach for arraying electrically conductive nano particles.

First, a stamp comprising a polymer such as a polydimethylsiloxane (PDMS) in which micro-convex portions are formed on a stamping surface in a predetermined distribution pattern is prepared. The stamping surface can also be formed by known approaches such as electron beam lithography, photo lithography and etching after stamp formation. It can also be formed by a concavity and convexity pattern on a mold face when molding. Upper surfaces of the micro-convex portions are formed in a size corresponding to the plane size of the above electrically conductive nano particles to form an array spacing and distribution pattern similar to those of the electrically conductive particles. An electrically conductive thin film such as Ag is deposited on a stamping surface having such a three-dimensional nanoscale structure by thermal deposition, electron beam deposition, sputtering or the like.

The three-dimensional stamp with an electrically conductive thin film obtained in this way is pressed against a semiconductor element surface on which surface treatment is performed with a compound having a functional group terminal to which an electrically conductive nano particle selectively binds so that only the convex portions make contacts with the semiconductor element surface. At this time, the electrically conductive thin film only at the contacted portions is transferred on the semiconductor element by the interaction between the surface of the electrically conductive thin film material and the functional group terminals. After transferring, the compound having a functional group terminal is removed, and ultraviolet or electron beam irradiation, plasma treatment or the like is performed so that the electrically conductive thin film may be directly bonded with the semiconductor element. Subsequently, the top semiconductor element 101 is stacked on the bottom semiconductor element 102 on which electrically conductive nano particles have been arranged, and then bonding of the elements is performed under appropriate pressure and heating. An organic or inorganic based adhesive or adhesive material is not used in the bonding. The bonding may be achieved by using only van der Waals force, or may be achieved by performing the direct bonding method or the heat solid phase diffusion method after surface activation. Known surface activation treatment methods can be used such as plasma treatment, ozone treatment, treatment with an ion beam and the like.

In addition, the aforementioned electrically conductive thin film is not particularly limited to Ag, and metals such as Au, Cu, Pt, Pd and Al; or electrically conductive oxides such $In_2O_3$ and ZnO can also be used. Further, in order to create electrically conductive nano particles comprising a composite metal, two or more of the above materials can also be used at the same time.

Further, functional groups in the above compounds to which electrically conductive nano particles bind include an amino group and a thiol group. The compounds having a functional group terminal are preferably compounds (a SAM forming compound) which can form a self-assembled monolayer (SAM), including, but not limited to, for example, trialkoxysilanes having a terminal thiol group such as 3-mercaptopropyltrimethoxysilane-4-mercaptophenyltrimethoxysilane; trialkoxysilanes having a terminal amino group such as 3-aminopropyltrimethoxysilane-4-aminophenyltrimethoxysilane.

Moreover, in the present invention, the microcontact printing methods used for arraying electrically conductive nano particles are not limited to those described above. Any methods may be used as long as they can be used for the method of bonding semiconductor elements according to the present invention. For example, a method may be used in which a SAM forming compound on a stamping surface formed in a predetermined distribution pattern can be transferred on a semiconductor element surface to precipitate electrically conductive nano particles on the transferred SAM.

When forming an array pattern of electrically conductive nano particles on a semiconductor element surface using the microcontact printing methods as described above, plane shapes and an array pattern of the electrically conductive nano particles depend on a concavity and convexity pattern on a stamping surface. Therefore, the plane shapes and the array pattern of electrically conductive nano particles may be appropriately selected within a performance range of microprocessing for forming a stamping surface. This allows a significantly improved degree of freedom in designing the plane shapes and the array pattern of electrically conductive nano particles as compared with a case in which they are formed using a block copolymer thin film as a template. As a result, the plane shapes and the array pattern of electrically conductive nano particles which are preferred in terms of designing optical characteristics and the light trapping effect resulted therefrom can be obtained. Such preferred plane shapes of electrically conductive nano particles include spherical, hemispherical, cylindrical and ellipsoidal. Such array patterns include hexagonal, regular hexagonal (or pseudo-regular hexagonal), rectangular and square (or pseudo-square) [Note that the term "pseudo-..." used for describing the shapes means that the standard deviation of side length in each shape is not more than 30% of the average side length (preferably not more than 20%, more preferably not more than 10%).

EXAMPLES

Below, the present invention will be further described in detail with reference to Examples. However, the present invention is not limited to these Examples in any way, and various modifications in materials and designs and adjustments in settings may be possible without departing the spirit of the present invention.

Example 1

FIG. 4 shows an example of a photoelectric conversion semiconductor element (a solar cell) as one of the embodiments. In this Example, an example is shown in which two solar cells comprising a cell 301 having an $Al_{0.3}Ga_{0.7}$ light absorbing layer as a top solar cell and a cell 302 having a CIGSe semiconductor layer as a bottom solar cell were bonded together. The GaAs based solar cell 301 comprises a p-type GaAs buffer layer 303, a p-type $Al_{0.3}Ga_{0.7}As$ light absorbing layer 304, an n-type GaAs emitter layer 305, an n-type GaAs contact layer 306 and an n-type electrode AuGeNi 307. The n-type electrode has a comb-shaped form in order to receive sunlight. The CIGSe based solar cell 302 comprises a Mo electrode 309, a CIGSe semiconductor layer 310, a CdS emitter layer 311 and a ZnO transparent conductive layer 312 on a glass substrate 308. In this case, an array of nano particles 313 is formed on a surface of the CIGSe based solar cell 302. Nano particles of Pd were used in this Example.

The Pd nano particles 313 were arrayed on the CIGSe based solar cell 302 by forming a thin film of polystyrene-poly-2-vinylpyridine as a block copolymer and using it as a template. Briefly, a 0.5 weight % ortho-xylene solution of polystyrene-poly-2-vinylpyridine having a total molecular weight of 265000 g/mol (the molecular weight of polystyrene: 133000 g/mol, the molecular weight of poly-2-vinylpyridine: 132000 g/mol) was spin-coated on a surface of the CIGSe cell 302 to form a thin film. Then, the solar cell 302 was dipped in a 1 mM $Na_2PdCl_4$ aqueous solution for 300 seconds. After washing with water, palladium nano particles 313 having an average size of 50 nm which were not covered with organic molecules were aligned and arrayed by performing argon plasma treatment on this cell. The average array spacing between palladium nano particles in this configuration was 100 nm. Then, bonding was performed by pressure-bonding in this Example. Briefly, water was dropped on the CIGSe based cell 302, and then the GaAs based cell 301 was positioned in place for temporary bonding of the both elements through surface tension. Then, pressure was applied for 30 minutes or more while heating at 150° C. to perform bonding under the condition where the Pd nano particles 313 were present between the elements.

The aforementioned solar cells are not particularly limited to the GaAs based solar cell and the CIGSe based solar cell. They include, for example, solar cells comprising one junction or two or more junctions grown on, for example, a InP or GaSb substrate; crystalline Si solar cells; amorphous Si solar cells; microcrystalline Si solar cells; organic solar cells; sensitized solar cells; solar cells in which a chalcopyrite based material is used; and combinations thereof.

Further, the bonding approaches are not limited to pressure-bonding, and direct bonding of elements through surface activation, for example, using plasma or an ion beam can be used in general.

Further, the electrically conductive nano particles are not particularly limited to Pd, and metal nano particles such as Au, Ag, Pt, Ni, Al, Zn and In or metal oxide nano particles having electric conductivity such as ZnO and $In_2O_3$ can be used.

Furthermore, the size of electrically conductive nano particles is not limited to 50 nm, and the applicable range is 10 to 200 nm.

Moreover, the array spacing of electrically conductive nano particles is not limited to 100 nm, and any distance can be used as long as it is not less than 2 times and not more than 10 times of the size of the nano particles.

Next, the performance of the solar cell according to this Example will be described. FIG. 5 shows the IV characteristics of the solar cell. In FIG. 5, (a) shows the characteristics of the solar cell manufactured according to this Example of the present invention, and (b) shows the characteristics of the junction structure with no Pd nano particle present therein. By this, in (a), an open voltage of 1.62 V and a fill factor of 0.53 were obtained, and a characteristic corresponding to a predicted one for a two-junction cell (an open voltage of 1.92 V) was achieved. In contrast, the IV characteristics appeared to be significantly deteriorated in (b). That is, the open voltage was 1.65V while the fill factor was decreased down to 0.23. Junction resistance estimated from each characteristic is 200 Ωcm$^2$ or more for the conventional structure while it is 10 Ωcm$^2$ for the structure according to the present invention. That is, the difference in junction resistance has led to the improved IV characteristics.

Example 2

FIG. 6 shows an example of a photoelectric conversion semiconductor element (a solar cell) as one of the embodiments. In this Example, an example is shown in which two solar cells comprising a cell 501 comprising a GaAs based light absorbing layer as a top solar cell, and a cell 502 comprising an InP based semiconductor layer as a bottom solar cell were bonded together. The GaAs based solar cell 501 comprises a p-type GaAs buffer layer 503, a p-type GaAs light absorbing layer 504, an n-type GaAs emitter layer 505, an n-type $Ga_{0.51}In_{0.49}P$/P-type $Ga_{0.51}In_{0.49}P$ (506/507) tunnel layer, a p-type $Ga_{0.51}In_{0.49}P$ light absorbing layer 508, an n type $Ga_{0.51}In_{0.49}P$ emitter layer 509, an n-type GaAs contact layer 510 and an n-type electrode AuGeNi 511. The n-type electrode has a comb-shaped form in order to receive sunlight. The InP based solar cell 502 comprises a p-type InP buffer layer 513, a p-type $In_{0.91}Ga_{0.09}As_{0.2}P_{0.8}$ light absorbing layer 514 (band gap energy: 1.2 eV), an n-type $In_{0.91}Ga_{0.09}As_{0.2}P_{0.8}$ emitter layer 515 and an n-type InP layer 516 on a InP substrate 512. In this case, a nano particle array 517 is formed on a surface of the InP based solar cell 502. Nano particles of Au were used in this Example. Note that the compositions of InGaAsP are design factors, which can be appropriately adjusted depending on an intended property.

The Au nano particles 517 were arrayed on the InP based solar cell 502 by forming a thin film of polystyrene-poly-2-vinylpyridine as a block copolymer and using it as a template. Briefly, a 0.3 weight % toluene solution of polystyrene-poly-2-vinylpyridine having a total molecular weight of 183500 g/mol (the molecular weight of polystyrene: 125000 g/mol, the molecular weight of poly-2-vinylpyridine: 58500 g/mol) was spin-coated on a surface of the InP based solar cell 502 to form a thin film. Then, the solar cell 502 was dipped in a 1 mM KAuCl$_4$ aqueous solution for 600 seconds. After washing with water, the Au nano particles 517 having an average size of 10 nm which were not covered with organic molecules were aligned and arrayed by performing argon plasma treatment on this cell. The average spacing between Au nano particles in this configuration was 30 nm. After this, bonding was performed by pressure-bonding in this Example. Briefly, water was dropped on the InP based cell 502, and then the GaAs based cell 501 was positioned in place for temporary bonding of the both elements through surface tension. Then, pressure was applied for 30 minutes or more while heating at 150° C. to perform bonding under the condition where the Au nano particles 517 were present between the elements.

Next, the performance of the solar cell according to this Example will be described. FIG. 7 shows the IV characteristics of the solar cell. In FIG. 7, (a) shows the characteristics of the solar cell manufactured according to this Example of the present invention, and (b) shows the characteristics of the junction structure with no Au nano particle present. By this, in (a), an open voltage of 2.90 V and a fill factor of 0.69 were obtained, and a characteristic corresponding to a predicted one for a three-junction cell (an open voltage of 2.97 V) was achieved. In contrast, the IV characteristics appeared to be significantly deteriorated in (b). That is, the open voltage was 2.56 V while the fill factor was decreased down to 0.45. Junction resistance estimated from each characteristic is 200 Ωcm$^2$ or more for the conventional structure while it is 20 Ωcm$^2$ or less for the structure according to the present invention. That is, the difference in junction resistance has led to the improved IV characteristics.

Note that a structure having the InGaAsP light absorbing layer 514 over the InP board 512 was used as a bottom cell in this Example, but a structure in which an InGaAsP light absorbing layer or an InGaAs distorted light absorbing layer is formed on a Ge substrate can also be used.

Example 3

FIG. 8 shows an example of a photoelectric conversion semiconductor element (a solar cell) as one of the embodiments. In this Example, an example is shown in which two solar cells comprising a solar cell 701 comprising an amorphous Si light absorbing layer as a top solar cell, and a solar cell 702 comprising a crystalline Si based semiconductor layer as a bottom solar cell were bonded together. The amorphous Si solar cell 701 comprises a ZnO transparent electrically conductive layer 703, an n-type amorphous Si layer 704, an i-type amorphous Si light absorbing layer 705, a p-type amorphous Si layer 706, a fluorine doped SnO$_2$ transparent electrically conductive layer 707 and a glass substrate 708. The crystalline silicon solar cell 702 comprises an n-type crystalline Si layer 710, a p-type crystalline Si layer 711 and an ITO transparent electrically conductive layer 712 on an Al electrode 709. In this case, a nano particle array 713 is formed on a surface of the crystalline Si solar cell 702. Nano particles of Pt were used in this Example.

The Pt nano particles 713 were arrayed on a crystalline silicon based cell by forming a thin film of polystyrene-poly-4-vinylpyridine as a block copolymer, and using it as a template. Briefly, a 0.6 weight % toluene solution of polystyrene-poly-4-vinylpyridine having a total molecular weight of 39000 g/mol (the molecular weight of polystyrene: 20000 g/mol, the molecular weight of poly-4-vinylpyridine: 19000 g/mol) was spin-coated on a surface of the crystalline Si based solar cell 702 to form a thin film. Next, the solar cell 702 was dipped in a 1 mM Na$_2$PtCl$_4$ aqueous solution for 1800 seconds. After washing with water, Pt nano particles 712 having an average size of 20 nm which were not covered with organic molecules were aligned and arrayed by performing argon plasma treatment on this cell. The average spacing between Pt nano particles in this configuration was 40 nm. After this, bonding was performed by pressure-bonding in this Example. Briefly, water was dropped on the crystalline silicon based cell 702, and then the amorphous silicon based cell 701 was positioned in place for temporary bonding of the both elements through surface tension. Then, pressure was applied for 30 minutes or more while heating at 150° C. to perform bonding under the condition where the Pt nano particles 712 were present between the elements.

Next, the performance of the solar cell according to this Example will be described. When the characteristics of the solar cell manufactured according to this Example were compared with those of a junction structure with no Pt nano particle present therein, an open voltage of 1.45 V and a fill factor of 0.63 were obtained in the former, and a characteristic corresponding to a predicted one for a two-junction cell (an open voltage of 1.5 V) was achieved. In contrast, the IV characteristics for the latter appeared to be significantly deteriorated. That is, the open voltage was 1.40 V while the fill factor was decreased down to 0.25. Junction resistance estimated from each characteristic is 100 Ωcm² or more for the conventional structure while it is 10 Ωcm² or less for the structure according to the present invention. That is, the difference in junction resistance has led to the improved IV characteristics.

As shown in Examples 1 to 3 described above, in the case of the structures according to the present invention, good solar cell characteristics can be obtained because of significantly improved junction resistance without impairing light transmittance at an interface by arraying a monolayer of electrically conductive nano particles at a bonding interface of various solar cells, and performing bonding while maintaining such a state. Note that the use of the present invention is not limited to solar cells, but can be widely applied to bonding of semiconductor elements which require electric conductivity and light transmittance.

Example 4

FIG. 9 shows an example of a photoelectric conversion semiconductor element (a solar cell) as one of the embodiments. In this Example, an example is shown in which two solar cells comprising a cell 901 comprising a GaAs based light absorbing layer as a top solar cell, and a cell 902 comprising an InP based semiconductor layer as a bottom solar cell were bonded together. The GaAs based solar cell 901 comprises a p-type GaAs buffer layer 903, a p-type GaAs light absorbing layer 904, an n-type GaAs emitter layer 905, an n-type InGaP emitter layer 906, an n-type GaAs contact layer 907 and an n-type electrode AuGeNi 908. The n-type electrode has a comb-shaped form in order to receive sunlight. The InP based solar cell 902 comprises a p-type InP buffer layer 910, a p-type $In_{0.83}Ga_{0.17}As_{0.37}P_{0.63}$ light absorbing layer 911 (band gap energy: 1.15 eV), an n-type $In_{0.83}Ga_{0.17}As_{0.37}P_{0.63}$ emitter layer 912 and an n-type InP layer 913 on an InP substrate 909. In this case, a nano particle array 914 is formed on a surface of the InP based solar cell 902. Nano particles of Ag were used in this Example. Note that the compositions of InGaAsP are design factors, which can be appropriately adjusted depending on an intended property.

The Ag nano particles 914 were arrayed on the InP based cell by a transfer approach using a stamp comprising polydimethylsiloxane (PDMS) in which micro-convex portions were formed. Briefly, an Ag thin film having a thickness of 50 nm was formed by electron beam deposition on a PDMS stamp on which column structures having a diameter of 230 nm and a height of 200 nm had been hexagonally arrayed with a center-to-center distance of 460 nm. Then, only convex portions on the Ag thin-filmed stamp were allowed to make contact with the InP based solar cell 902 having a 3-mercaptopropyltrimethoxysilane SAM on its surface for 5 minutes at room temperature to transfer the Ag nano particle structures. Then Ag nano particles (cylindrical) 914 having a diameter of 230 nm and a height of 50 nm which were not covered with organic molecules were aligned and arrayed as shown in FIG. 3. The center-to-center distance of Ag nano particles was 460 nm in this configuration. After this, in this Example, the GaAs based cell 901 and the InP based cell 902 were bonded together by pressure-bonding. Briefly, water was dropped on the InP based cell 902, and then the GaAs based cell 901 was positioned in place for temporary stacking of the both elements through surface tension. Then, pressure was applied for 30 minutes or more while heating at 150° C. to perform bonding under the condition where the Ag nano particles 914 were present between the elements.

Next, the performance of the solar cell according to this Example will be described. As the characteristics of the solar cell manufactured according to this Example were measured (refer to FIG. 10), an open voltage of 1.3 V, a short-circuit current of 14.8 mA and a power generation efficiency of 11.8% were obtained, and characteristics exceeding those predicted for a two junction cell (open voltage: 1.5 V, short-circuit current: 11.7 mA, power generation efficiency: 11%) were achieved. That is, the two cells are electroconductively connected by the Ag nano particles as in Examples 1 to 3. In addition to this, the efficient light trapping effect is produced for the bottom InP based cell in this Example. Therefore, a value of short-circuit current significantly exceeding a predicted one can be achieved, resulting in an improved power generation efficiency for the cell as a whole.

As shown in Example 4 above, in the case of the structure according to the present invention, good solar cell characteristics can be obtained by arraying a monolayer of electrically conductive nano particles at a solar cell bonding interface, and performing bonding while maintaining such a state to achieve electrically conductive connection between different solar cells, and to allow designed optical characteristics favorable for element characteristics at an interface. Note that the use of the present invention is not limited to solar cells, but can be widely applied to bonding of semiconductor elements which require electric conductivity and designed optical characteristics at an interface.

The present invention relates to a method for bonding semiconductor elements and a junction structure, which can be used for multiple junctions of semiconductor elements which require electric conductivity and transparency or designed optical characteristics at a bonding interface.

DESCRIPTION OF REFERENCE NUMERALS

101: Semiconductor element junction structure
102: Bottom semiconductor element
103: Top semiconductor element
104: Electrically conductive nano particle
301: GaAs based solar cell (GaAs based cell)
302: CIGSe based solar cell (CIGSe based cell)
303: p-GaAs buffer layer
304: p-$Al_{0.3}Ga_{0.7}As$ light absorbing layer
305: n-GaAs emitter layer
306: n-GaAs contact layer
307: n-AuGeNi comb-shaped electrode
308: Glass substrate
309: Mo electrode
310: CIGSe semiconductor layer
311: CdS emitter layer
312: ZnO transparent electrode
313: Pd nano particle
501: GaAs based solar cell (GaAs based cell)
502: InP based solar cell (InP based cell)
503: p-GaAs buffer layer
504: p-GaAs light absorbing layer
505: n-GaAs emitter layer
506: n-$Ga_{0.51}In_{0.49}P$ tunnel layer
507: p-$Ga_{0.51}In_{0.49}P$ tunnel layer
508: p-$Ga_{0.51}In_{0.49}P$ light absorbing layer
509: n-$Ga_{0.51}In_{0.49}P$ emitter layer
510: n-GaAs contact layer
511: n-AuGeNi comb-shaped electrode
512: InP substrate 513: p-InP buffer layer
514: p-In$_{0.91}$Ga$_{0.09}$As$_{0.2}$P$_{0.8}$ light absorbing layer
515: n-In$_{0.91}$Ga$_{0.09}$As$_{0.2}$P$_{0.8}$ emitter layer
516: n-InP layer
517: Au nano particle
701: Amorphous Si solar cell (Amorphous silicon based cell)
702: Crystalline Si solar cell (Crystalline silicon based cell)
703: ZnO transparent electrically conductive layer
704: n-amorphous Si layer
705: i-amorphous Si light absorbing layer
706: p-amorphous Si layer
707: Fluorine doped SnO$_2$ transparent electrically conductive layer
708: Glass substrate
709: Al electrode
710: n-crystalline Si layer
711: p-crystalline Si layer
712: ITO transparent electrically conductive layer
713: Pt nano particle
901: GaAs based solar cell (GaAs based cell)
902: InP based solar cell (InP based cell)
903: p-GaAs buffer layer
904: p-GaAs light absorbing layer
905: n-GaAs emitter layer
906: n-InGaP emitter layer
907: n-GaAs contact layer
908: n-AuGeNi comb-shaped electrode
909: InP substrate
910: p-InP buffer layer
911: p-In$_{0.83}$Ga$_{0.17}$As$_{0.37}$P$_{0.63}$ light absorbing layer
912: n-In$_{0.83}$Ga$_{0.17}$As$_{0.37}$P$_{0.63}$ emitter layer
913: n-InP layer
914: Ag nano particle

The invention claimed is:

1. A method of bonding a pair of semiconductor elements, comprising: arraying separate, individual, non-aggregated electrically conductive nano particles not covered with organic molecules and being separated from other nanoparticles of the array by empty voids on a surface of one of the pair of semiconductor elements, each of the pair of semiconductor elements includes a photoelectric conversion element that converts light into electric energy, and pressure-bonding the other of the pair of semiconductor elements thereagainst so that the electrically conductive nano particles are present in a bonding interface between the pair of semiconductor elements, wherein the electrically conductive nano particles form a monolayer and, during said pressure-bonding, the pair of semiconductor elements is in a state in which the semiconductor elements are bonded with each other through and in direct contact with the monolayer of the electrically conductive nano particles present between the pair of semiconductor elements, wherein the electrically conductive nano particles have a size of between 10 nm and 200 nm inclusive, wherein an array spacing between the electrically conductive nano particles is between 2 times and 10 times inclusive of the size of the electrically conductive nano particles thereby forming the empty voids between the separate, individual, non-aggregated nanoparticles, and wherein an array pattern of the electrically conductive nano particles is hexagonal or square.

2. The method according to claim 1, wherein an array of the electrically conductive nano particles on the surface of the one of the pair of semiconductor elements is formed using a block copolymer thin film as a template.

3. The method according to claim 1, wherein an array of the electrically conductive nano particles on the surface of the one of the pair of semiconductor elements is formed by a transfer approach using a stamp having a shape pattern thereon.

4. The method according to claim 1, wherein an array spacing between the electrically conductive nano particles is between 3 times and 7 times inclusive of the size of the electrically conductive nano particles.

5. The method according to claim 1, wherein the electrically conductive nano particles are made of one or more selected from the group consisting of Pd, Au, Ag, Pt, Ni, Al, In, In$_2$O$_3$, Zn, ZnO, and compounds thereof.

6. The method according to claim 1, wherein each of the pair of semiconductor elements is a single junction solar cell in which a crystalline Si based, an amorphous Si based, a microcrystalline Si based, an organic based, or a chalcopyrite based material is used, or is a solar cell comprising 2 or more junctions grown on a GaAs, InP, GaSb or Ge substrate or the like.

7. A junction structure, comprising:
a pair of semiconductor elements, each of the pair of semiconductor elements includes a photoelectric conversion element that converts light into electric energy; and
an array of separate, individual, non-aggregated electrically conductive nanoparticles, each of the nanoparticles being not covered with organic molecules, being separated from other nanoparticles of the array by empty voids, and being present in a bonding interface between the pair of semiconductor elements,
wherein the array of the electrically conductive nanoparticles forms a monolayer;
wherein each of the electrically conductive nanoparticles has a size of between 10 nm and 200 nm inclusive;
wherein the electrically conductive nanoparticles in the array have an array spacing which is between 2 to 10 times inclusive of the size of the electrically conductive nanoparticles thereby forming the empty voids between the separate, individual, non-aggregated nanoparticles;
wherein the array of the electrically conductive nanoparticles is in a pattern which is hexagonal or square; and
wherein the pair of semiconductor elements is in a state in which the semiconductor elements are bonded with each other through and in direct contact with the monolayer of the electrically conductive nanoparticles present between the pair of semiconductor elements.

8. The junction structure according to claim 7, wherein each of the pair of semiconductor elements includes a semiconductor layer or an electrically conductive layer on a surface thereof to be bonded to form the bonding interface.

9. The junction structure according to claim 7, wherein the bonding interface including the array of the electrically conductive nanoparticles is optically transparent.

10. The junction structure according to claim 9, wherein each of the pair of semiconductor elements is a solar cell.

11. The junction structure according to claim 7, wherein the array spacing is between 3 to 7 times inclusive of the size of the electrically conductive nanoparticles.

12. The junction structure according to claim 7, wherein the electrically conductive nanoparticles are made of one or more selected from the group consisting of Pd, Au, Ag, Pt, Ni, Al, In, In$_2$O$_3$, Zn, ZnO, and compounds thereof.

13. The junction structure according to claim 7, wherein each of the pair of semiconductor elements is a single junction solar cell in which a crystalline Si based, an amorphous Si based, a microcrystalline Si based, an organic based, or a chalcopyrite based material is used, or is a solar cell comprising 2 or more junctions grown on a GaAs, InP, GaSb or Ge substrate or the like.

14. The junction structure according to claim 7, wherein the electrically conductive nanoparticles are one or more selected from the group consisting of Pd, Au, Pt, Ni, In, $In_2O_3$, Zn, ZnO, and compounds thereof.

15. The junction structure according to claim 7, wherein the empty voids in the monolayer of the array of separate, individual, non-aggregated electrically conductive nanoparticles contain only gas or air.

* * * * *